(12) United States Patent
Cranford, Jr. et al.

(10) Patent No.: US 7,405,620 B2
(45) Date of Patent: Jul. 29, 2008

(54) DIFFERENTIAL AMPLIFIER AND METHOD

(75) Inventors: Hayden C. Cranford, Jr., Cary, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 11/458,712

(22) Filed: Jul. 20, 2006

(65) Prior Publication Data

US 2008/0018400 A1   Jan. 24, 2008

(51) Int. Cl.
*H03F 3/45* (2006.01)
(52) U.S. Cl. .................................... 330/253; 330/257
(58) Field of Classification Search ................ 330/253, 330/257, 258, 261
See application file for complete search history.

(56) References Cited

U.S. PATENT DOCUMENTS

| | | | |
|---|---|---|---|
| 3,908,173 A | 9/1975 | Mundock | |
| 4,021,751 A * | 5/1977 | Suzuki | 330/253 |
| 4,037,170 A | 7/1977 | Richards | |
| 4,567,389 A | 1/1986 | Van Tran | |
| 4,839,609 A * | 6/1989 | Hara et al. | 330/253 |
| 5,142,243 A * | 8/1992 | Eddlemon | 330/253 |
| 5,541,555 A | 7/1996 | Pernici | |
| 6,281,753 B1 | 8/2001 | Corsi et al. | |
| 6,639,431 B1 | 10/2003 | Potter | |
| 6,703,898 B2 * | 3/2004 | Renous | 330/253 |
| 6,717,467 B2 * | 4/2004 | Renous et al. | 330/253 |
| 2002/0190793 A1 | 12/2002 | Moon | |

FOREIGN PATENT DOCUMENTS

JP   61-194906   8/1986
JP   2004179900   6/2004

* cited by examiner

*Primary Examiner*—Henry K Choe
(74) *Attorney, Agent, or Firm*—Joscelyn G. Cockburn

(57) ABSTRACT

A method of forming a differential amplifier on a substrate which has a greater tolerance for applied voltages and a chip so formed. The differential amplifier circuit on a substrate has additional transistors connected with resistors which form a voltage divider, thereby sharing the voltage stress which may be applied and accommodating enhanced capabilities for the differential amplifier.

6 Claims, 1 Drawing Sheet

DIFFERENTIAL AMPLIFIER AND METHOD

FIELD AND BACKGROUND OF INVENTION

This invention relates to a semiconductor differential amplifier and a method a forming such an amplifier.

Integrated circuits based on semiconductor manufacturing process are well known. Such devices are understood to be formed by providing a suitable base and then forming electrical circuit components on the substrate. Such devices are understood to be formed with many such components on a single substrate, with such components functioning as transistors, resistors and other elements. Microprocessors, as one example only, are so formed and have large numbers of components of the types described formed on the substrates supporting the components. This technology is well known and needs no further description here.

Many such integrated circuit devices or chips use as one type of component a differential amplifier. Differential amplifiers have been long recognized in the art, to the extent that there exist entire texts devoted to the characteristics and design of such amplifiers and their inclusion in large scale integrated circuits. The interested reader is referred to such texts for a deeper understanding of the invention here to be described.

Differential amplifiers function due to the imposition of voltages thereacross, and serve, among other purposes, to amplify the differences between two input voltages (hence the name) and to remove noise otherwise present in signals by operating in so-called common mode. One difficulty encountered with integrated circuits formed by the use of certain technologies is that voltages may be applied across a differential amplifier which result in either signal distortion beyond acceptable limits or damage to the components forming the amplifier. This is particularly true where the chip is made by a technology which is only capable of offering thin oxide transistors with limited maximum voltage tolerance.

SUMMARY OF THE INVENTION

With the foregoing in mind, it is one purpose of this invention to provide a method of forming a differential amplifier on a substrate which has a greater tolerance for applied voltages and a chip so formed. In realizing this purpose, provision is made for sharing voltage stress imposed.

More particularly, a purpose of this invention is to form a differential amplifier circuit on a substrate with additional transistors connected with resistors which form a voltage divider, thereby sharing the voltage stress which may be applied and accommodating enhanced capabilities for the differential amplifier.

BRIEF DESCRIPTION OF DRAWINGS

Some of the purposes of the invention having been stated, others will appear as the description proceeds, when taken in connection with the accompanying drawing, in which the differential amplifier circuit of this invention is shown in FIG. 1.

DETAILED DESCRIPTION OF INVENTION

Figure 1:
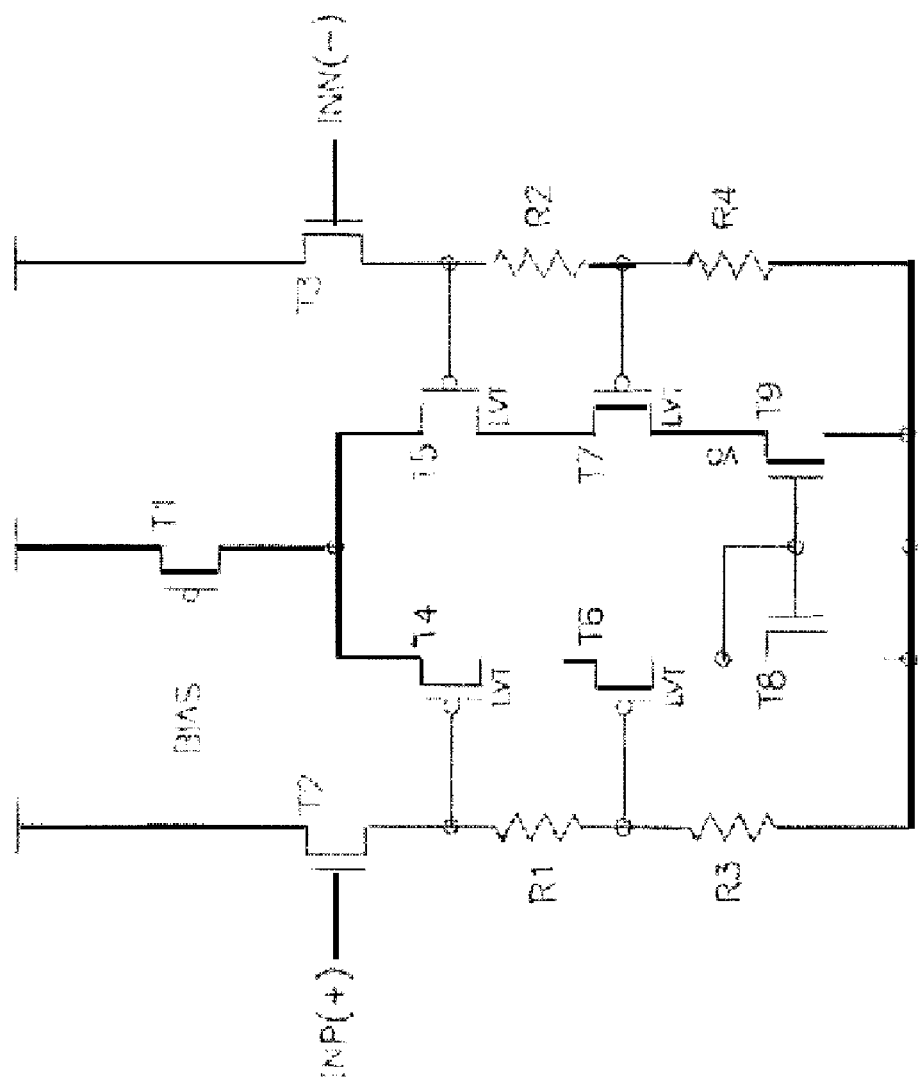

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Referring now to FIG. 1. The differential amplifier of this invention is there shown. The elements shown are formed on a substrate (not shown) as is conventional and well known in semiconductor manufacturing. It is the presence of this general knowledge on which reliance is placed for the absence of a specific illustration of the substrate.

The differential amplifier has a plurality of transistors, conductive traces coupling those transistors, and resistors. One transistor, $T_1$ serves to supply a bias to the other elements of the amplifier. A pair of transistors, $T_2$ and $T_3$, serve as points for input of voltage signals into the amplifier, buffering an input differential voltage, input positive (INP) and input negative (INN).

Two pairs of low $V_t$ transistors (LVT), $T_4$ and $T_5$ and $T_6$ and $T_7$, are connected between the input point transistors and an output pair of transistors $T_8$ and $T_9$. These LVT elements are those which may be vulnerable to voltage stress during operation at higher $V_{in}$ and $V_{cc}$ operation.

In order to provide protection for the LVT elements during such operation, the present invention contemplates the inclusion of a set of resistors, $R_1, R_2, R_3, R_4$ arranged to function as a voltage divider and connected with the two pairs of LVT transistors. Preferably, the resistors have a common value, resulting in the buffered input voltages being divided by a factor of two, sharing the voltage stress among the four LVT transistors. This operation is essentially present in both low and high common mode bias.

In the manufacture of a chip incorporating a differential amplifier as here described, the method which is implemented proceeds by forming on a suitable substrate a complex of electrical circuit components including transistors and resistors; with the forming including forming a pattern of transistors into a differential amplifier. The differential amplifier thus produced is formed to have a first pair of transistors receiving input voltages; two pairs of low $V_t$ (LVT) transistors coupled to the first pair of transistors, each pair having one transistor coupled in series with one transistor of the other pair; and four resistors coupled to the two pairs of LVT transistors in voltage dividing array. In this arrangement, the voltage dividing array of resistors protect the LVT transistors against excessive voltage stress during operation of the differential amplifier. As has been described hereinabove.

In the drawings and specifications there has been set forth a preferred embodiment of the invention and, although specific terms are used, the description thus given uses terminology in a generic and descriptive sense only and not for purposes of limitation.

What is claimed is:

1. Method comprising:
   forming on a suitable substrate a complex of electrical circuit components including transistors and resistors;
   the forming including forming a pattern of transistors into a differential amplifier having:
   a first pair of transistors receiving input voltages;
   two pairs of low $V_t$ (LVT) transistors coupled to the first pair of transistors, each pair having one transistor coupled in series with one transistor of the other pair; and
   four resistors coupled to the two pairs of LVT transistors in voltage dividing array; wherein one of said resistors is connected between gates of a series connected pair of said Low Voltage Transistors and wherein other of said resistors is connected between gates of other series connected pair of said Low Voltage Transistors;

the voltage dividing array of resistors protecting the LVT transistors against excessive voltage stress during operation of the differential amplifier.

2. Method according to claim 1 wherein the forming of the resistors provides a resistance value common among the four resistors.

3. Method according to claim 1 wherein the forming of the complex of electrical components provides a sharing of voltage stress among the LVT transistors during operation at higher $V_{in}$ and $V_{cc}$ operating points.

4. Apparatus comprising:

a substrate;

a complex of electrical circuit components formed on said substrate and defining a differential amplifier, said components including:

a first pair of transistors receiving input voltages;

two pairs of low $V_t$ (LVT) transistors coupled to the first pair of transistors, each pair having one transistor coupled in series with one transistor of the other pair; and four resistors coupled to the two pairs of LVT transistors in voltage dividing array; wherein one of said resistors is connected between gates of a series connected pair of said Low Voltage Transistors and wherein other of said resistors is connected between gates of other series connected pair of said Low Voltage Transistors;

the voltage dividing array of resistors protecting the LVT transistors against excessive voltage stress during operation of the differential amplifier.

5. Apparatus according to claim 4 wherein said four resistors have a common resistance value.

6. Apparatus according to claim 4 wherein said LVT transistors share voltage stress during higher $V_{in}$ and $V_{cc}$ operating points.

* * * * *